(12) United States Patent
Ufert

(10) Patent No.: US 7,655,939 B2
(45) Date of Patent: Feb. 2, 2010

(54) MEMORY CELL, MEMORY DEVICE AND METHOD FOR THE PRODUCTION THEREOF

(75) Inventor: Klaus-Dieter Ufert, Unterschleißheim (DE)

(73) Assignee: Infineon Technologies AG, Neubiberg (DE)

( * ) Notice: Subject to any disclaimer, the term of this patent is extended or adjusted under 35 U.S.C. 154(b) by 319 days.

(21) Appl. No.: 11/399,744

(22) Filed: Apr. 7, 2006

(65) Prior Publication Data

US 2006/0255329 A1   Nov. 16, 2006

(30) Foreign Application Priority Data

Apr. 8, 2005   (DE) .................. 10 2005 016 244

(51) Int. Cl.
*H01L 29/02* (2006.01)
*H01L 21/00* (2006.01)

(52) U.S. Cl. ................ 257/2; 438/3; 977/811; 365/49.13

(58) Field of Classification Search .......... 438/3, 438/95; 977/818; 257/2, 260, 295
See application file for complete search history.

(56) References Cited

U.S. PATENT DOCUMENTS

| | | | | |
|---|---|---|---|---|
| 6,815,818 B2* | 11/2004 | Moore et al. | ................. | 257/751 |
| 7,056,409 B2* | 6/2006 | Dubrow | ................. | 156/276 |
| 7,297,975 B2* | 11/2007 | Ufert | ................. | 257/2 |
| 7,332,377 B2* | 2/2008 | Happ et al. | ................. | 438/129 |
| 2004/0113139 A1* | 6/2004 | DeHon et al. | ................. | 257/9 |
| 2005/0017759 A1 | 1/2005 | Weber et al. | | |
| 2005/0224888 A1 | 10/2005 | Graham et al. | | |
| 2007/0217252 A1* | 9/2007 | Symanczyk | ................. | 365/153 |

FOREIGN PATENT DOCUMENTS

| | | |
|---|---|---|
| DE | 102 50 830 A1 | 5/2004 |
| DE | 102 56 486 A1 | 7/2004 |

* cited by examiner

*Primary Examiner*—W. David Coleman
(74) *Attorney, Agent, or Firm*—Dicke, Billig & Czaja, P.L.L.C.

(57) ABSTRACT

A nonvolatile memory cell, a memory device and a corresponding production method are disclosed. In one embodiment, a memory material region is in this case provided as memory element between a first electrode device and a second electrode device. The memory material region can be activated by means of at least one species. The memory material region is formed with or from a nanostructure.

34 Claims, 9 Drawing Sheets

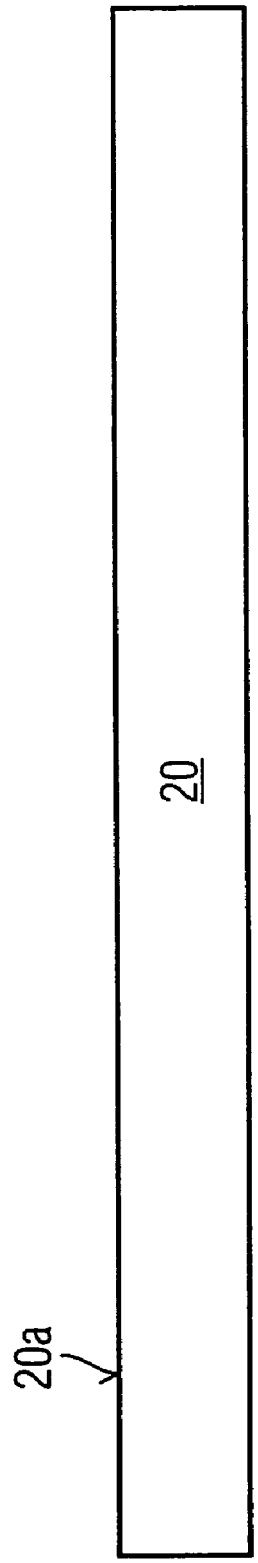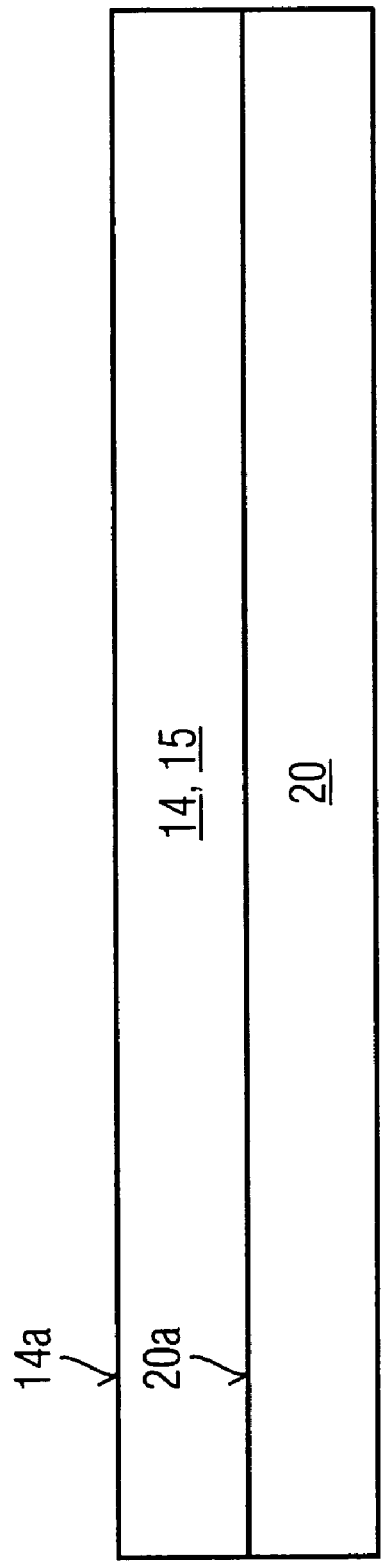

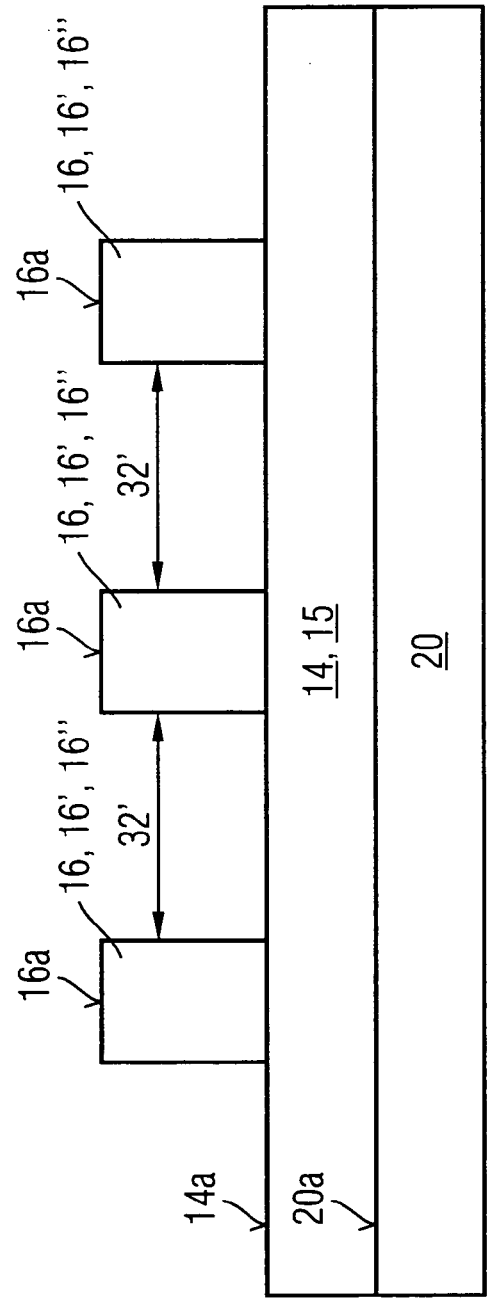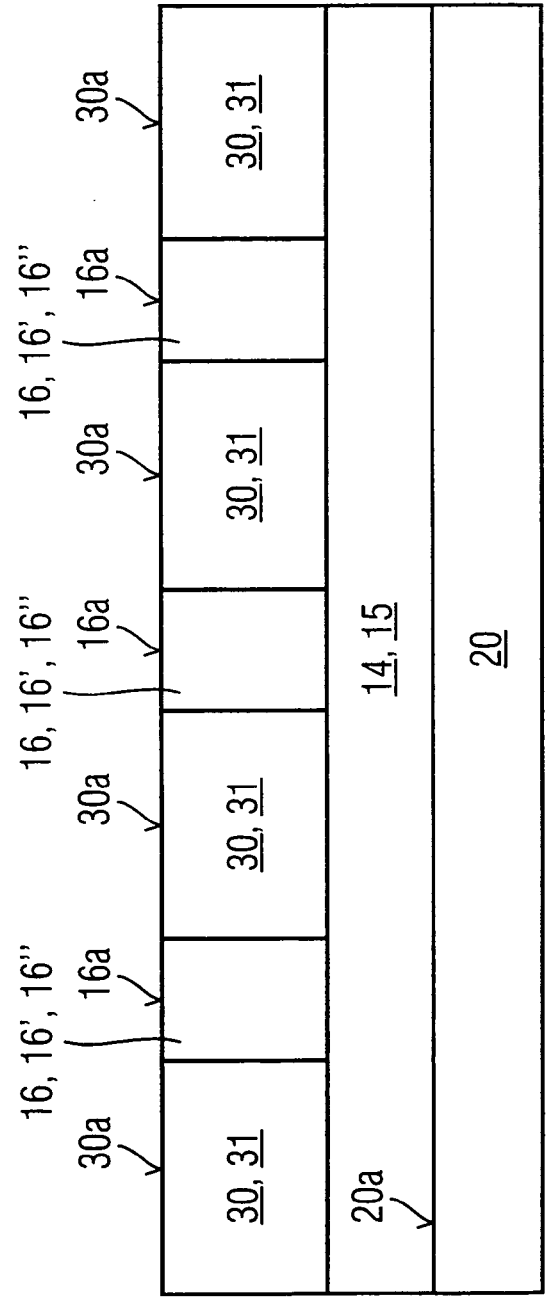

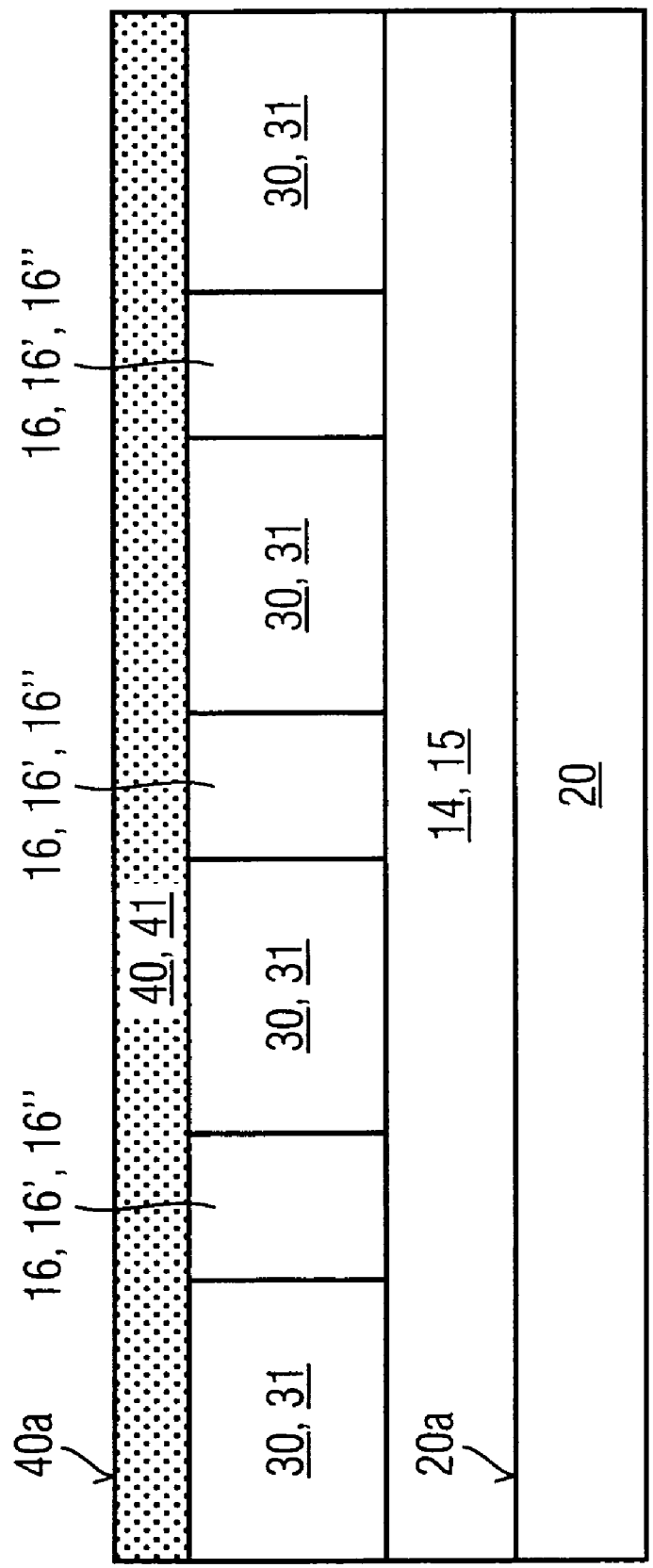

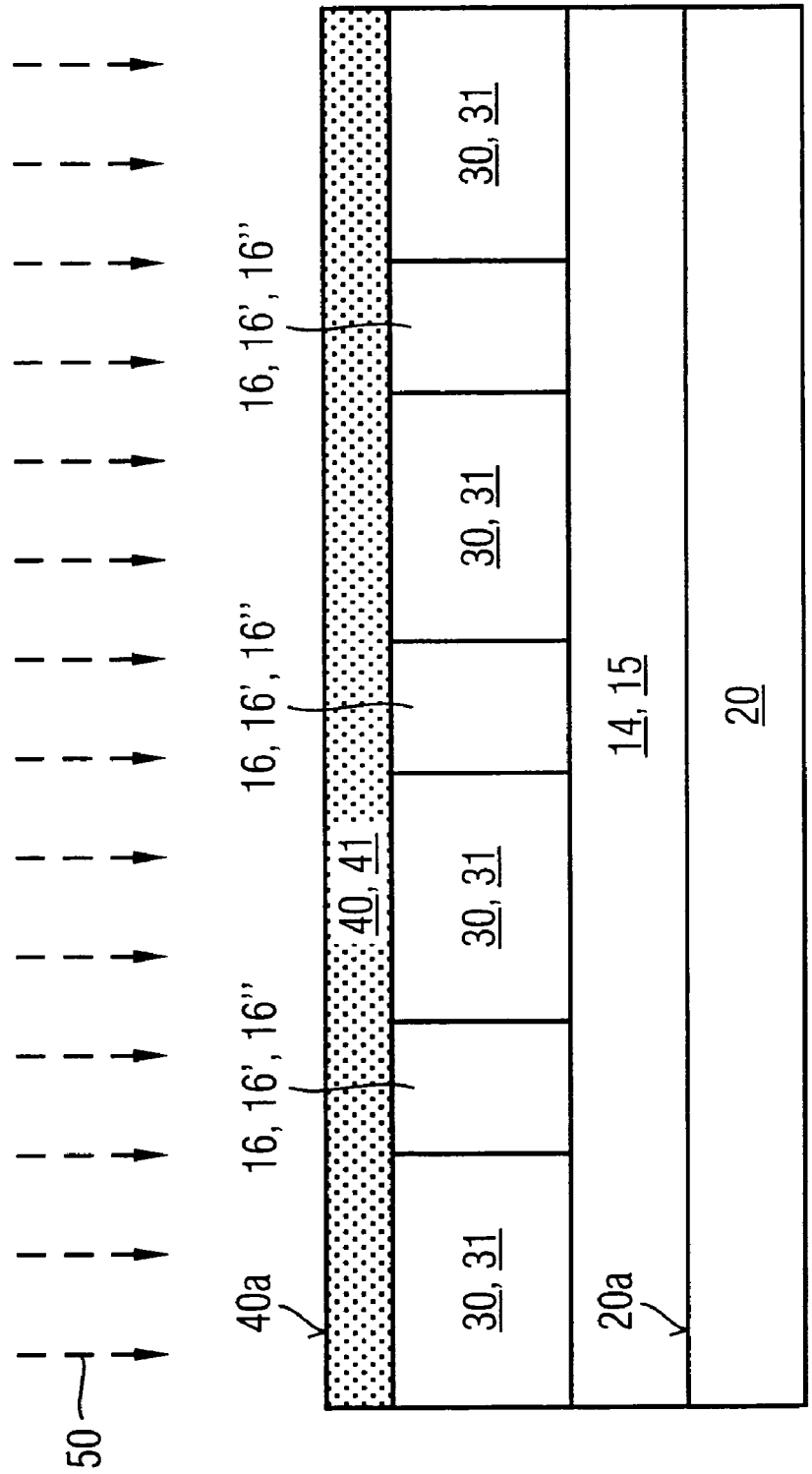

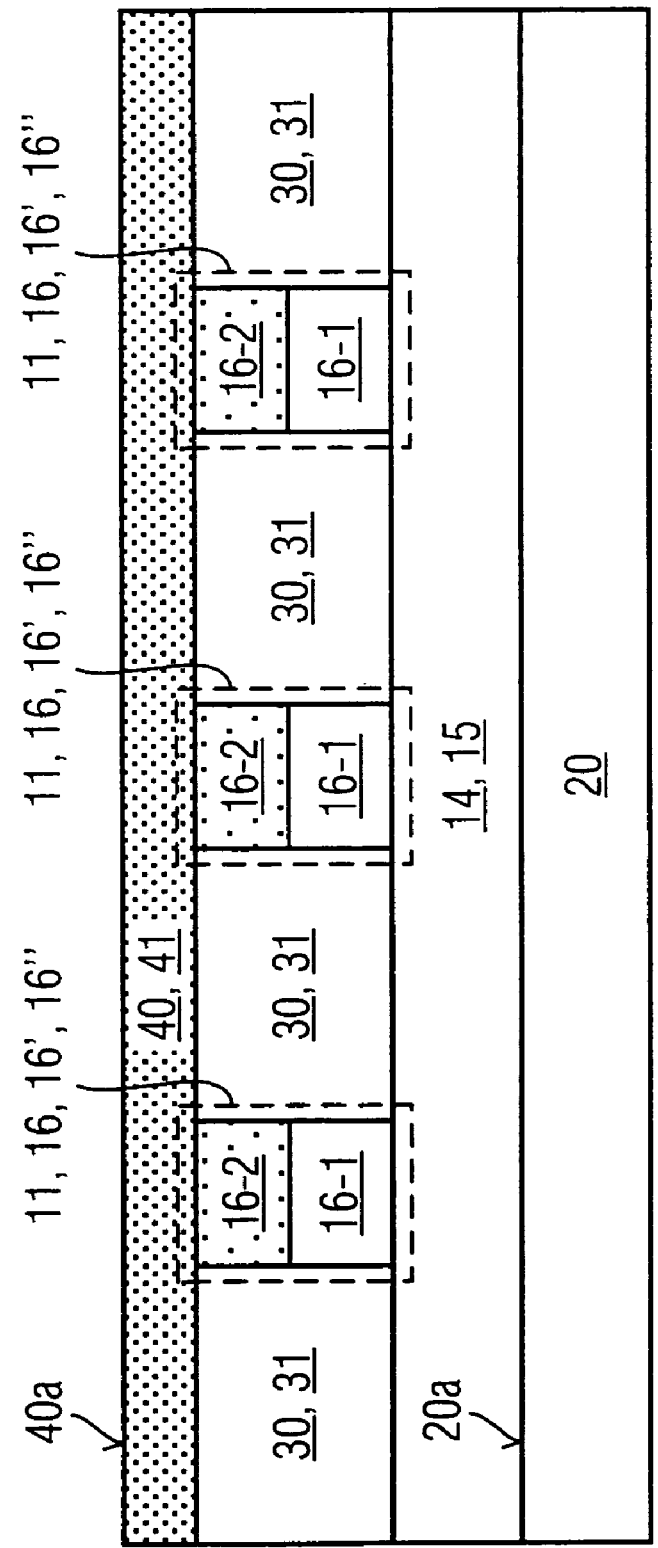

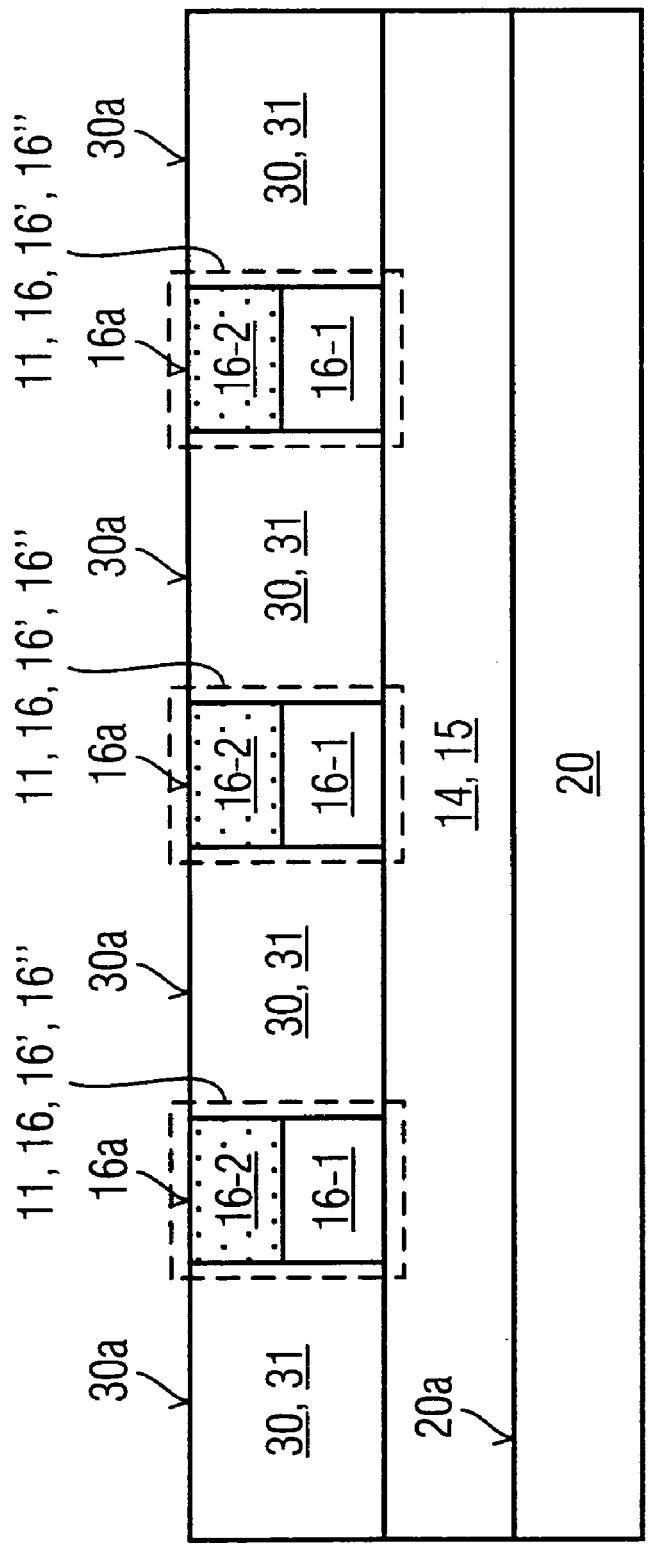

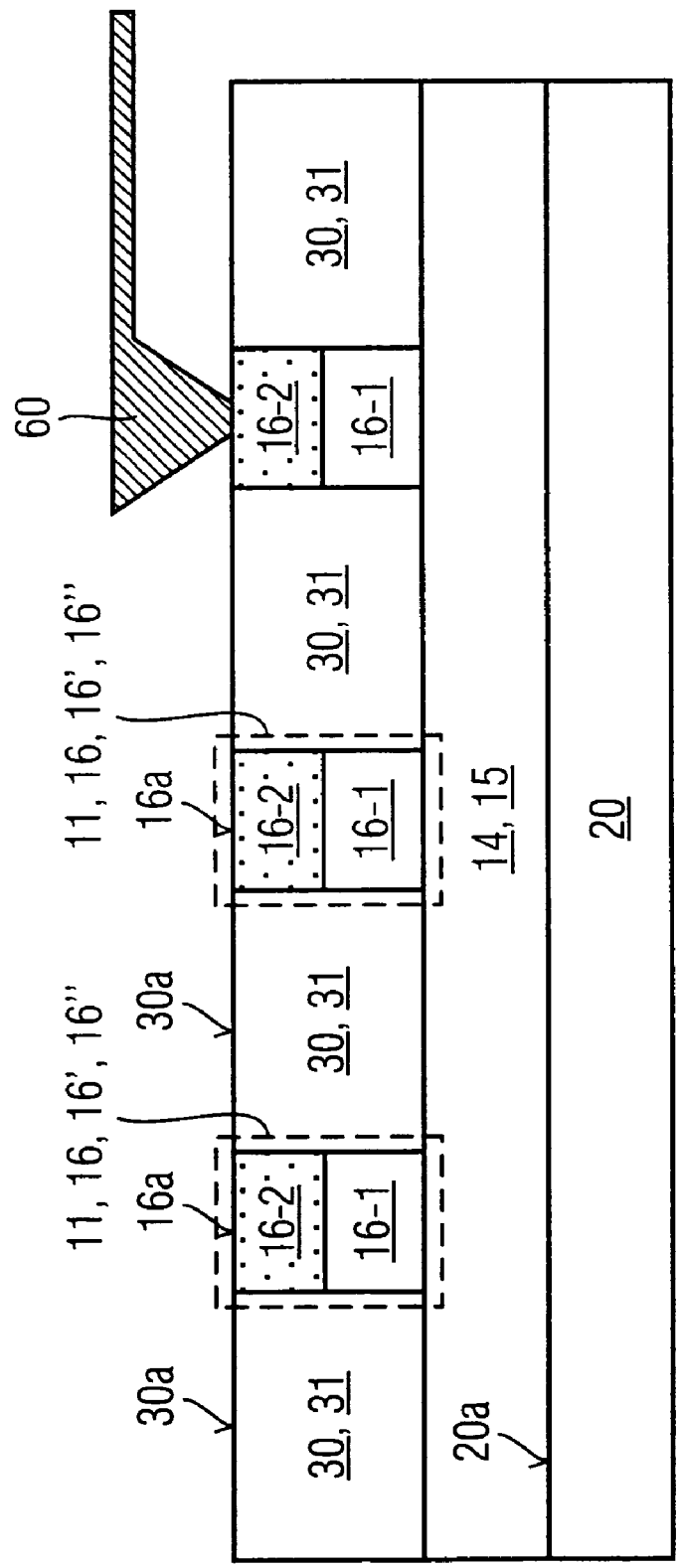

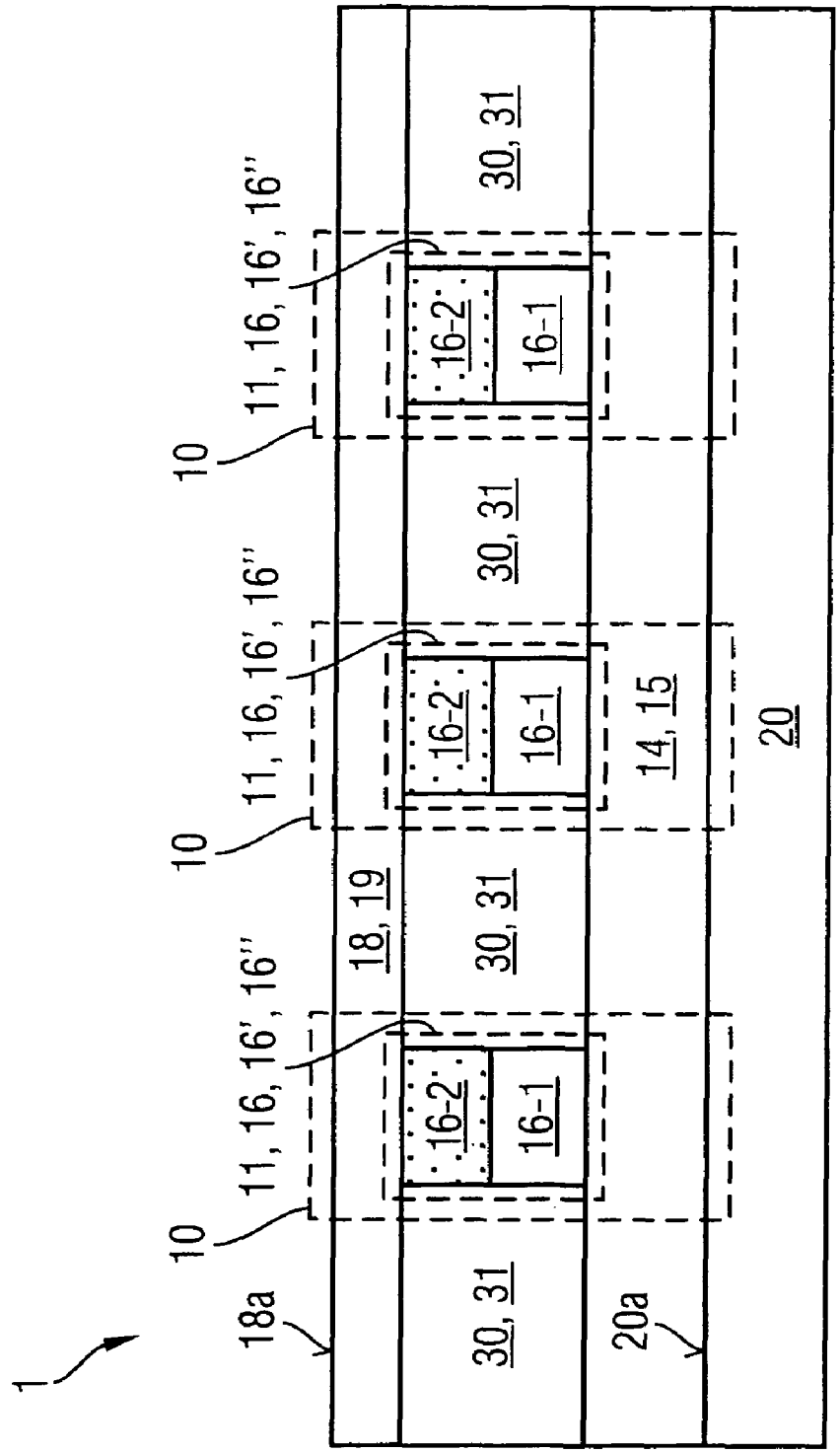

US 7,655,939 B2

MEMORY CELL, MEMORY DEVICE AND METHOD FOR THE PRODUCTION THEREOF

CROSS-REFERENCE TO RELATED APPLICATIONS

This Utility patent application claims priority to German Patent Application No. DE 10 2005 016 244.4, filed on Apr. 8, 2005, which is incorporated herein by reference.

FIELD OF INVENTION

The present invention relates to a memory cell, a memory device and a method for the production thereof. The invention relates in particular to a method for producing a resistively switching nonvolatile memory element.

BACKGROUND

In the further development of modern semiconductor memory technologies, in order to achieve a highest possible integration density whilst at the same time increasing or maintaining a high processing speed and sufficient functional integrity, novel memory concepts are also being investigated and developed further in addition to typical silicon technologies in the area of nonvolatile memory devices. In the case of so-called resistively switching memory cells, different conductivity states, which are assigned to different information states, can be formed in a memory material that inherently has poor electrical conductivity, e.g., in a solid electrolyte or in a chalcogenide material, by introducing one or more activating species in the context of an activation operation.

In known memory concepts of this type, what is critical for the operating time or cycle time between a storage operation and an erasure operation is that period of time which is required to form the conductivity state, e.g., via the formation of corresponding current paths, and also that period of time which is necessary to withdraw or erase a conductivity state, e.g., by removing or deconstructing an existing current path.

For these and other reasons there is a need for the present invention.

SUMMARY

The present invention provides a nonvolatile memory cell, a memory device and a corresponding production method. In one embodiment, a memory material region is provided as memory element between a first electrode device and a second electrode device. The memory material region can be activated by means of at least one species. The memory material region is formed with or from a nanostructure.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

These and further aspects of the present invention are explained in more detail below with reference to preferred embodiments on the basis of the accompanying schematic drawings.

FIGS. 1-10 illustrate in schematic and sectional side view intermediate stages or intermediate states which are attained in a one embodiment of a production method according to the invention.

DETAILED DESCRIPTION

Figure 11:
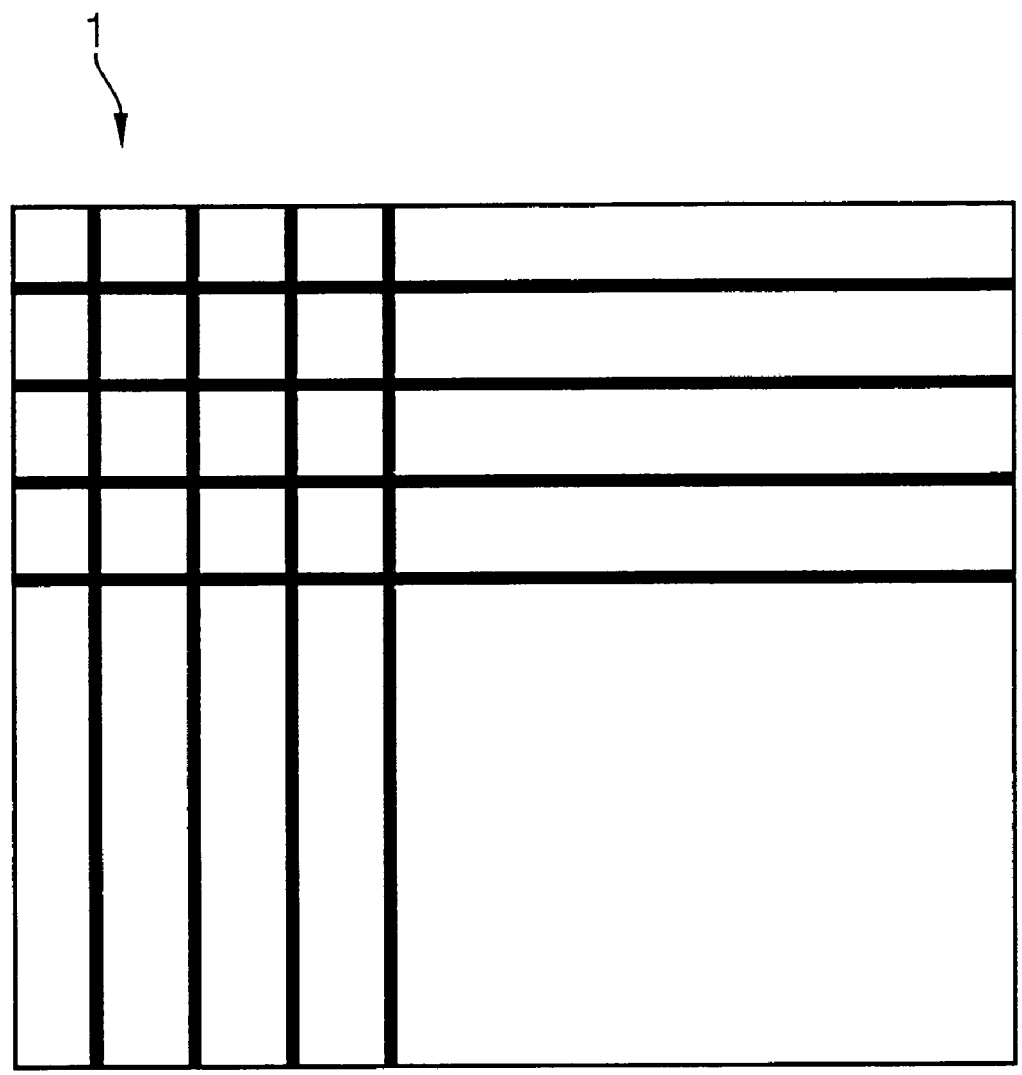
FIG. 11 illustrates in schematic and sectional plan view an embodiment of the memory device according to the invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides a memory, so that the withdrawal of a memory state and of a corresponding current conduction path and thus a corresponding erasure operation can be performed comparatively rapidly.

In one embodiment, the invention provides a nonvolatile memory cell, in which a memory material region that is activated or can be activated by means of at least one species is provided as memory element between a first or bottom electrode device and a second or top electrode device, and in which the memory material region is formed with or from a nanostructure.

In one embodiment, the present invention, in the case of a corresponding memory cell, forms the underlying memory material region of the memory element with or from a nanostructure. This measure enables a geometrical miniaturization of the memory element and/or thinning out of the underlying current paths or a formation of the memory element with a comparatively smaller number of underlying current paths in the memory material, whereby the erasure times are also reduced.

In one embodiment of a nonvolatile memory cell according to the present invention, the nanostructure may be formed as a self-assembled structure.

In another embodiment of a nonvolatile memory cell according to the present invention, the nanostructure may be formed partially or completely in oxidic fashion.

Furthermore, in accordance with a further embodiment of the nonvolatile memory cell according to the present invention, the nanostructure is formed with or from nanoparticles.

In particular, it is advantageous if, in accordance with a one additional or alternative embodiment of the nonvolatile memory cell according to the present invention, the nanostructure is formed from an individual nanoparticle.

In addition or as an alternative in another embodiment of the nonvolatile memory cell according to the present invention, the memory material region and, in particular, the nanostructure may be formed with or from one material or a plurality of materials from the group consisting of a tungsten oxide or WOx, a titanium oxide or TiOx and a molybdenum oxide or MoOx.

It is particularly advantageous if, in addition or as an alternative in another advantageous development of the nonvolatile memory cell according to the present invention, the nanostructure is formed as a monolayer.

It is particularly advantageous if, in accordance with another alternative or additional embodiment of the nonvolatile memory cell according to the present invention, the nanostructure and, in particular, the nanoparticle are formed with or from a sequence of layers or regions.

It is furthermore advantageously provided, in another alternative or additional refinement of the nonvolatile memory cell according to the present invention, that the nanostructure and, in particular, the nanoparticle are formed with a lateral extent in the range of approximately 7 nm to approximately 3 nm.

In another embodiment of the nonvolatile memory cell according to the present invention, the memory element and, in particular, the nanoparticle may additionally or alternatively be formed with a lateral area dimensioning in the range of approximately 7 nm×7 nm.

Furthermore, in another embodiment of the nonvolatile memory cell according to the present invention, it may be provided that the nanostructure and, in particular, the nanoparticle are formed with or from a chalcogenide material or a solid electrolyte.

Various advantageous material refinements are appropriate with regard to the electrodes as well.

Thus, in another embodiment of the nonvolatile memory cell according to the present invention, it may be provided as an alternative or in addition that the first or bottom electrode device is formed with or from one material or a plurality of materials from the group formed by tungsten, molybdenum, titanium and the nitrides thereof.

As an alternative or in addition, in accordance with another embodiment of the nonvolatile memory cell according to the present invention, it is conceivable that the second or top electrode device is formed with or from one material or a plurality of materials from the group formed by silver, copper and aluminum.

In accordance with one embodiment of the nonvolatile memory cell according to the present invention, a species from the group consisting of metal ions, silver ions and silver cations may additionally or alternatively be provided as one or as the activating species.

In accordance with another embodiment of the nonvolatile memory cell according to the present invention, the memory element and, in particular, the nanoparticle may be embedded laterally in an insulation region.

As an alternative thereto, it is conceivable that, in accordance with another embodiment of the nonvolatile memory cell according to the present invention, the memory element and, in particular, the nanoparticle are formed in cutouts or in a cutout of an insulation region provided between the first or bottom electrode device and the second or top electrode device.

As an alternative or in addition, it is also conceivable that, in accordance with embodiment of the nonvolatile memory cell according to the present invention, the memory element and, in particular, the nanoparticle are formed with a comparatively small number of potential current paths or conduction paths, in particular with a number of current paths in the range of approximately 1 to approximately 5.

The nonvolatile memory cell according to the present invention is preferably formed as a CBRAM cell.

A further embodiment of the present invention provides a method for producing a memory cell.

The invention provides a method for producing a nonvolatile memory cell, in which a memory material region that is activated or can be activated by means of at least one species is provided as memory element between a first or bottom electrode device and a second or top electrode device, and in which the memory material region is formed with or from a nanostructure.

Consequently, it is a central idea of the production method according to the present invention, in the case of a corresponding memory cell, to form the underlying memory material region of the memory element with or from a nanostructure. This measure enables a geometrical miniaturization of the memory element and/or thinning out of the underlying current paths or a formation of the memory element with a comparatively smaller number of underlying current paths in the memory material, whereby the erasure times are also reduced.

In one embodiment of the method for producing a nonvolatile memory cell according to the present invention, the nanostructure may be formed as a self assembled structure.

In addition or as an alternative, in another embodiment of the method for producing a nonvolatile memory cell according to the present invention, the nanostructure may be formed partially or completely in oxidic fashion.

Furthermore, it is conceivable as an alternative or in addition that, in accordance with a further embodiment of the method for producing a nonvolatile memory cell according to the present invention, the nanostructure is formed with or from nanoparticles.

In addition or as an alternative in another advantageous embodiment of the method for producing a nonvolatile memory cell according to the present invention, the memory material region and, in particular, the nanostructure may be formed with or from one material or a plurality of materials from the group consisting of a tungsten oxide or WOx, a titanium oxide or TiOx and a molybdenum oxide or MoOx.

It is particularly advantageous if, in addition or as an alternative in another advantageous embodiment of the method for producing a nonvolatile memory cell according to the present invention, the nanostructure is formed as a monolayer.

It is particularly advantageous if, in accordance with another alternative or additional embodiment of the method for producing a nonvolatile memory cell according to the present invention, the nanostructure and, in particular, the nanoparticle are formed with or from a sequence of layers or regions.

It is furthermore advantageously provided, in another alternative or additional refinement of the method for producing a nonvolatile memory cell according to the present invention, that the nanostructure and, in particular, the nanoparticle are formed with a lateral extent in the range of approximately 7 nm to approximately 3 nm.

In another preferred embodiment of the method for producing a nonvolatile memory cell according to the present invention, the memory element and, in particular, the nanoparticle may additionally or alternatively be formed with a lateral area dimensioning in the range of approximately 7 nm×7 nm.

Furthermore, in another embodiment of the method for producing a nonvolatile memory cell according to the present invention, it may be provided that the nanostructure and, in particular, the nanoparticle are formed with or from a chalcogenide material or a solid electrolyte.

Various advantageous material refinements during production are appropriate with regard to the electrodes as well.

Thus, in another embodiment of the method for producing a nonvolatile memory cell according to the present invention, it may be provided as an alternative or in addition that the first or bottom electrode device is formed with or from one material or a plurality of materials from the group formed by tungsten, molybdenum, titanium and the nitrides thereof.

As an alternative or in addition, in accordance with another embodiment of the method for producing a nonvolatile memory cell according to the present invention, it is conceivable that the second or top electrode device is formed with or from one material or a plurality of materials from the group formed by silver, copper and aluminum.

In accordance with a another embodiment of the method for producing a nonvolatile memory cell according to the present invention, a species from the group consisting of metal ions, silver ions and silver cations may additionally or alternatively be provided as one or as the activating species.

In accordance with another another embodiment of the method for producing a nonvolatile memory cell according to the present invention, the memory element and, in particular, the nanoparticle may be formed in a manner embedded laterally in an insulation region.

As an alternative thereto, it is conceivable that, in accordance with another embodiment of the method for producing a nonvolatile memory cell according to the present invention, the memory element and, in particular, the nanoparticle are formed in cutouts or in a cutout of an insulation region provided between the first or bottom electrode device and the second or top electrode device.

As an alternative or in addition, it is also conceivable that, in accordance with another embodiment of the method for producing a nonvolatile memory cell according to the present invention, the memory element and, in particular, the nanoparticle are formed with a comparatively small number of potential current paths or conduction paths, in particular with a number of current paths in the range of approximately 1 to approximately 5.

The nonvolatile memory cell according to the present invention is preferably formed as a CBRAM cell.

Furthermore, the present invention also provides a memory device. The latter has, according to the invention, a plurality of memory cells according to the invention.

These and further aspects of the present invention are explained in more detail below using different words:

The invention also relates in particular to a method for producing a resistively switching and nonvolatile memory cell.

The invention provides a nonvolatile memory element which is distinguished by a good scalability, e.g., down to nanoscale dimensions, that ensures low switching voltages in conjunction with short switching times and achieves a high number of switch cycles in conjunction with good thermal stability.

In contrast thereto, the memory concepts used hitherto, e.g. floating gate memories, flash memories and DRAM concepts, will encounter scaling limits in the foreseeable future on account of their mechanism based on storage of charges.

Furthermore, as in the case of the flash concept, the high switching voltages and the limited number of read and write cycles and as in the case of the DRAM, the very limited duration of the storage of the charge state constitute additional problems which have hitherto been unable to be optimally solved.

The memory concept proposed with this invention offers an alternative to the flash and DRAM concepts and avoids the problems described in both technologies: [M. Kozicki, WO97/48032, 1997, and literature cited therein], [M. Kozicki, U.S. Pat. No. 6,418,049 B1, 2002, and literature cited therein], [M. Kozicki, WO03/032392 A2 3, 2003, and M. Kozicki, U.S. Pat. No. 2003/0209728 A1, 2003, and literature cited therein].

This invention is intended to improve in particular the switch-off behavior or the behavior during an erase operation in the case of WOx memory elements in the direction of shorter erasure times.

This is done according to the invention in particular by virtue of the fact that the active memory elements are formed in the form of oxidized nanoparticles with dimensions in the range of approximately 3 nm to approximately 7 nm on the bottom electrode.

The majority of known technologies follow the principle of charge storage, to be precise based on the materials used in the standard CMOS processes. The problem which exists in the case of the DRAM concept of the leakage currents in the storage capacitor, leading to loss of charge, is solved only unsatisfactorily at the present time by means of the stored charge continually being refreshed.

In the case of the flash concepts, the problem of the limited write and read cycles is combated by providing barrier layers, while an optimum solution has still not been found at the present time for the high voltages and slow read and write cycles.

The memory concept used here is not based on the storage of charges, but rather on the difference in resistance between two stable states in the memory material region of the memory cell. This effect can be brought about e.g., by a high mobility of e.g., silver ions in e.g., an insulating WOx matrix material under an applied electric field.

While the programming of such a memory element can be effected in the nanoseconds range, the erasure process is considerably slower in conventional cells of this type.

During programming, for the memory element it is sufficient that, with a field present, a current path or a conductive, elementary Ag bridge forms through the WOx matrix material from the top electrode to the bottom electrode. In the low-resistance on state, however, in the case of structures having relatively large dimensions, one or more independent Ag bridges with relatively large lateral dimensions reach the bottom electrode, and they then have to be resolved into Ag ions and electrons again during the erasure operation at opposite polarity. This process until the high resistance state is reestablished has hitherto been effected in a considerably longer period of time. A method or device for noticeably shortening these erasure times of the CBRAM has not been disclosed hitherto.

The memory concept described in the invention is not based on the storage of charges, but rather on the difference in resistance between two stable states which is brought about by the high mobility of silver ions in a matrix material under an applied electric field.

In the programmed, low resistance state of the memory element, a continuous Ag ion bridge extending from the top electrode to the bottom electrode bridges the high resistance WOx matrix material.

While the programming of the memory element can be effected in the nanoseconds range, the erasure process is considerably slower. During programming, for the memory element it is sufficient that, with a field present, at least one current path or a conductive Ag bridge forms through the WOx matrix material from the top electrode to the bottom electrode. Further bridges that possibly arise no longer change anything, in principle, regarding the low resistance state because the matrix material is already short-circuited with the first bridge.

In the functioning of the CBRAM, in the case of the lateral dimensions of the memory element of approximately 50 nm, as have been achieved hitherto, evidently a plurality of bridges are formed or else, if only one bridge exists, the latter attains dimensions such that it takes a considerably longer time to resolve or interrupt said bridge again during the erasure operation.

The present invention provides an arrangement which makes it possible to reduce the number of conducting bridges and/or to prevent the formation of continuously larger cluster-like Ag ion bridges in the programmed state.

In one embodiment, only one current path is intended to be able to be formed per memory cell, that is to say per memory element.

The invention produces a nanomemory cell, for example, by means of a self-assembled WOx nanostructure, deposited on the W bottom electrode, which nanomemory cell, in particular on account of its lateral dimension in the range of approximately 3 nm to approximately 7 nm, generally permits only one current path or only one continuous Ag bridge from the top electrode through to the bottom electrode, in particular the dimension thereof being limited by the nanoparticle memory cell.

The formation of oxidic nanoparticles, e.g. of ZnO nanoparticles, is being technologically mastered in the meantime and, on account of the nature of the chemical synthesis, can be applied to many elements or molecules: [R. T. Clay, R. E. Cohen; Supramol. Science, Vol. 5 (1998)] and [R. F. Mulligan, A. Iliadis, P. Kofinas: J. Appl. Polymer Science, Vol. 89, (2003), p. 1058].

On account of the limited conglomerate extent of the Ag atoms in the WOx nanoparticle, it becomes possible to interrupt the continuous Ag bridges more rapidly in the low-resistance state, that is to say to separate the Ag bridge in the reoxidation operation at corresponding polarity into positive Ag ions and electrons and to supply them to the corresponding electrodes, and to return the memory element from the low-resistance state to the high-resistance state more rapidly, that is to say in shorter times with comparable current/voltage pulses. Moreover, the packing density of the CBRAM memory can be considerably increased with this solution approach since the effective memory cell can attain dimensions of 7 nm×7 nm and less.

One embodiment of the invention is based on the production or self-assembled deposition or SAM deposition of a nanoparticle structure from or with a WOx matrix material on the bottom electrode.

It is thus possible to reduce the effective area of the CBRAM memory cell to dimensions of approximately 7 nm×7 nm and smaller and consequently also to increase the packing density. By means of this nanoparticle memory cell, it is consequently possible to reduce the number of Ag cluster bridges that can form in the programmed state of the memory element to virtually one bridge.

It is thus possible to attain a bridge with a laterally very limited extent which can be resolved into Ag ions and electrons again by application of an erased pulse in considerably shorter times than in the manner realized hitherto.

One embodiment of the memory cell provides a sandwich construction or layer construction having:
a first electrode;
a nanoparticle structure;
a part of the WOx particle structure which is doped with Ag; and
a second electrode.

This arrangement can be realized in horizontal or vertical embodiment on a semiconductor substrate and is independent of the electrode materials chosen. One embodiment provides, however, for choosing the electrode materials from inert elements or elements having a high melting point, e.g. W, Mo, Ti, which form an ohmic contact with the Ag-doped oxidic matrix material. The chalcogenide material cited under b) may, in an advantageous embodiment, be one of the following compounds: WOx, TiOx, MoOx. Ag, Cu or Al is advantageously used for the second electrode.

The various oxidic nanoparticle materials may be used with dimensions of between 3 nm and 15 nm. The layer thickness of the nanoparticles should lie in the range of 3 nm to 5 nm, so that the nanoparticle matrix has an electrically insulating effect.

This sandwich-like or layer-like structure may be produced e.g. in the following manner:

The deposition of a first electrode layer, e.g., of or with Mo or W, may be performed by means of a conventional sputtering method or any other deposition method desired, e.g., vapor deposition, CVD methods, PLD, etc., This material is generally filled into a previously etched hole and then planarized by means of CMP (chemical mechanical polishing). Alternative patterning methods such as deposition and subsequent etching can be used in a correspondingly analogous manner. The first electrode fabricated in this way is subsequently coated with a dielectric and a hole is etched through said dielectric, so that the subsequently deposited chalcogenide material has a direct contact with the electrode layer. Besides the via structure, it is likewise possible to form the bottom electrode in a so-called plug form by producing a plug-type bottom electrode by means of lithographic methods, over which an insulating layer is subsequently deposited by means of CVD. The insulating layer is removed above the bottom electrode by means of CMP, so that the bottom electrode embedded in the insulating layer, open toward the top, can be covered with the nanomask.

The production of an oxidic nanomask structure is described comprehensively in [R. F. Mulligan, A. Iliadis, P. Kofinas: J. Appl. Polymer Science, Vol. 89, (2003), p. 1058] and [R. T. Clay, R. E. Cohen; Supramol. Science, Vol. 5 (1998) p. 41.] using the example of ZnO. Starting substances for the synthesis are diblock copolymers comprising polynorborene and polynorborene-dicarboxylic acid. These copolymers form the original for the nanoparticle structure. After the synthesis of the copolymer, the latter is dried and then brought into solution again, into which is then introduced the corresponding stoichiometric amount of WCl2 (obtained by disproportionation of the W tetrachloride) likewise in solution in tetrahydrofuran (THF). The WCl2+ cations combine in the solution with the carboxyl groups of the second copolymer in the block.

If this solution is applied to the substrate, for example a W bottom electrode layer, the layer grows in a self-assembled process in a hexagonally ordered manner. The solution can be applied by means of spinning or else the wafer can be dipped into the solution. The metal salt can be converted into a metal oxide by means of $NH_4OH$ alkaline solution and the copolymer can be removed by means of plasma etching. After this procedure, a nanomask structure formed from nanoparticles remains on the wafer. The particle size and the nanomask openings can be varied in dimensions of between 3 nm and 15 nm [K. Landfester; SFB 569 (TP G2), University of Ulm, 2004].

The application of the Ag doping layer by means of sputtering in an Ar atmosphere is followed by the photodiffusion of the Ag doping layer into the nanoparticles. The layer sequence produced in this way is then completed by means of the deposition of the second electrode in a sputtering process to give the memory cell. The appended illustration schematically shows the production process.

Functionally or structurally similar or comparable elements are designated by the same reference symbols below without a detailed description of the respective structures or elements being repeated on every occasion of their occurrence.

In accordance with the intermediate state illustrated in FIG. 1, firstly a semiconductor material region 20 having a surface region 20a is formed or provided, the surface region 20a being essentially planar.

In transition to the intermediate state illustrated in FIG. 2, a layer of a material 15 for a first or bottom electrode device 14 having a surface region 14a, 15a is then formed on the surface region 20a of the semiconductor material region 20.

In transition to the intermediate state illustrated in FIG. 3, a plurality of semiconductor material regions 16 for a plurality of semiconductor memory elements 10 to be formed are then formed equidistantly on the surface region 14a, 15a of the material 15 for the first or bottom electrode device 14. According to the invention, the memory material regions 16 are formed from or with a nanostructure 16'. In particular, each of the memory material regions 16 as such may also be formed in each case by an individual nanoparticle 16". The memory material regions 16 each have a surface region 16a. A cutout 32' is in each case provided between directly adjacent memory material regions 16, nanostructures 16' or nanoparticles 16; through which cutout the surface 14a of the underlying first electrode device 14 is uncovered.

In transition to the intermediate state illustrated in FIG. 4, the cutouts 32' or interspaces 32' provided between the memory material regions 16 are then filled with an insulation region 30 made of an insulation material 31, so that their surface regions 30a, 31a terminate flush with the surface regions 16a of the memory material regions 16.

The memory material regions 16 are composed e.g., of a solid electrolyte or of a chalcogenide material.

In transition to the intermediate state illustrated in FIG. 5, a layer 40 with or made of an activating material 41 having a surface region 40a, 41a is then deposited on the surface regions 30a and 16a of the insulation regions 30 and of the memory material regions 16, respectively. Said layer 40 and the activating material 41 comprise at least one activating species via which the memory material regions 16 can be activated.

In transition to the intermediate state illustrated in FIG. 6, an activating radiation 50 is then coupled in onto the structure of FIG. 5 via the surface region 40a of the layer 40 or of the activating material 41. In this way, the activating species from the layer 40 of the activating material 41 can enter into the memory material regions 16 via the surface 16a thereof and activate the respective memory material regions 16.

This is illustrated in FIG. 7, where transfer, that is to say photoinduced diffusion, of the species from the material layer 40 with the activating material 41 into the respective memory material regions 16 results in a bipartite structure in the latter, so that there are now present an unchanged first or lower region 16-1 of the memory material regions 16 and an activated second or upper region 16-2, which arise as a result of activating species being taken up by means of diffusion from the layer 40 and the activating material 41 as a reservoir. In this way, as is illustrated in FIG. 7, the respective memory material region 16 arises in the sense of a nanostructure 16', e.g., in each case in the sense of an individual nanoparticle 16", of the respective memory element 11 with a first or lower region 16-1 and a second or upper region 16-2 of the memory material region 16.

FIG. 8 illustrates that the layer 40 with the activating material 41 still present in FIG. 7 is either used up or else is removed from the surfaces 30a and 16a after the conclusion of the activation. Consequently, the surfaces 30a and 16a of the insulation regions 30 and of the memory material regions 16, respectively, are uncovered again.

In transition to the intermediate state illustrated in FIG. 9, it is possible, namely in an optional intermediate process, to make contact with the various surface regions 16a of the structure shown in FIGS. 8 and 9 by means of an atomic force or scanning tunneling microscope 60. This also permits a corresponding dimension or size analysis.

In transition to the intermediate state illustrated in FIG. 10, a material 19 for the second or top electrode device 18 having a surface region 18a is then formed on the surfaces 16a and 30a of the memory material regions 16 and, respectively, of the insulation regions 30 provided in between. The arrangement of FIG. 10 reveals that the first or bottom electrode device 14 and the second or top electrode device 18, in accordance with the structure shown in FIG. 10, are firstly formed jointly for all the memory cells 10 with the memory elements 11.

FIG. 11 additionally indicates, in a plan view of the structure illustrated in FIG. 10, how the individual memory cells 10 with the memory elements 11 in the context of a common memory device 1 on the underlying semiconductor material 20 can be isolated or singulated from one another.

In one embodiment of the production method according to the invention, e.g., on the surface 20a of a silicon wafer 20 and a tungsten bottom contact provided thereon as first or bottom electrode device 14, on the surface region 14a thereof, nanoparticles 16" made of a tungsten oxide are formed in a manner spaced apart laterally from one another, said nanoparticles forming the memory material region 16 with the nanostructure 16' for a respective memory cell 10 to be formed with a corresponding memory element 11. An insulation region 30 is then formed in the interspaces 32' between adjacent nanoparticles 16", e.g., by whole area deposition of a silicon dioxide layer, e.g., by means of CVD, and subsequent CMP stopping on the surface region 16a of the memory material regions 16. This is followed by the deposition of a reservoir layer 40 with an activating material 41, e.g., by sputtering of silver, with subsequent photodiffusion by means of corresponding radiation 50 being coupled in. The sputtered silver 41 thus serves as a silver diffusion layer 40 for the activation of the underlying memory material regions 16 or nanoparticles 16'. Afterwards, after the silver diffusion, the remaining silver layer is then removed by silver CMP or silver etching by means of a KJ/J2 solution, so that a W/WOx structure is present in this way as memory element 11 for a memory cell 10, e.g., with a top contact on an area of approximately 15 nm×16 nm. The above described WOx structure can be subdivided into segments by means of electron beam subdivision. A metal top contact can then be applied in a sputtered manner, e.g., using silver or using aluminum. What is then used as a memory element 11 is a combination of an undoped part 16-1 of a tungsten oxide nanoparticle 16", which is arranged at the bottom and is in direct contact with the surface 14a of the first or bottom electrode device 14, and a silver-doped part 16-2 of the silver doped tungsten oxide nanoparticle 16', which is formed at the top within the nanostructure 16' of the memory material region 16 and thus in direct contact with the second or top electrode device 18.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A nonvolatile memory cell comprising:
a first electrode;
a second electrode;
a memory material region activated by means of at least one species provided as a memory element between the first electrode and the second electrode;
wherein the memory material region is a nanostructure having a sublithographic lateral extent; and
wherein the nanostructure comprises at least one of: a self assembled structure, an individual nanoparticle, a monolayer, a comparatively small number of potential current paths or conduction paths in the range of approximately 1 to approximately 5.

2. The memory cell as claimed in claim 1, comprising wherein the nanostructure is formed partially or completely in oxidic fashion.

3. The memory cell as claimed in claim 1, comprising wherein the nanostructure is formed with or from nanoparticles.

4. The memory cell as claimed in claim 1, comprising wherein the memory material region including the nanostructure, are formed with or from one material or a plurality of materials from the group consisting of a tungsten oxide or WOx, a titanium oxide or TiOx and a molybdenum oxide or MoOx.

5. The memory cell as claimed in claim 1, comprising wherein the nanostructure including the nanoparticle are formed with or from a sequence of layers or regions.

6. The memory cell as claimed in claim 1, comprising wherein the nanostructure including the nanoparticle are formed with a lateral extent in the range of approximately 7 nm to approximately 3 nm.

7. The memory cell as claimed in claim 1, comprising wherein the memory element and the nanoparticle are formed with a lateral area dimensioning in the range of approximately 7 nm×7 nm.

8. The memory cell as claimed claim 1, comprising wherein the nanostructure, including the nanoparticle are formed with or from a chalcogenide material or a solid electrolyte.

9. The memory cell as claimed in claim 1, comprising wherein the first or bottom electrode device is formed with or from one material or a plurality of materials from the group formed by tungsten, molybdenum, titanium and the nitrides thereof.

10. The memory cell as claimed in claim 1, comprising wherein the second or top electrode device is formed with or from one material or a plurality of materials from the group formed by silver, copper and aluminum.

11. The memory cell as claimed claim 1, comprising wherein a species from the group consisting of metal ions, silver ions and silver cations is provided as one or as the activating species.

12. The memory cell as claimed in claim 1, comprising wherein the memory element and the nanoparticle are embedded laterally in an insulation region.

13. The memory cell as claimed in claim 1, comprising wherein the memory element and the nanoparticle are formed in cutouts of an insulation region provided between the first or bottom electrode device and the second or top electrode device.

14. The memory cell as claimed in claim 1, which is formed as a CBRAM cell.

15. A method for producing a nonvolatile memory cell comprising:
providing a memory material region as memory element between a first electrode device and a second electrode device;
activating the memory material region by means of at least one species;
wherein the memory material region is a nanostructure having a sublithographic lateral extent; and
wherein forming the nanostructure comprises at least one of: forming the nanostructure as a self assembled structure, forming the nanostructure from an individual nanoparticle, forming the nanostructure as a monolayer, and forming the nanostructure with a comparatively small number of potential current paths or conduction paths in the range of approximately 1 to approximately 5.

16. The method as claimed in claim 15, comprising forming the nanostructure partially or completely in oxidic fashion.

17. The method as claimed in claim 15, comprising forming the nanostructure with or from nanoparticles.

18. The method as claimed in claim 15, comprising forming the memory material region and, in particular, the nanostructure with or from one material or a plurality of materials from the group consisting of a tungsten oxide or WOx, a titanium oxide or TiOx and a molybdenum oxide or MoOx.

19. The method as claimed in claim 15, comprising forming the nanostructure and, in particular, the nanoparticle with a sequence of layers or regions.

20. The method as claimed in claim 15, comprising forming the nanostructure and, in particular, the nanoparticle with a lateral extent in the range of approximately 7 nm to approximately 3 nm.

21. The method as claimed in claim 15, comprising forming the memory element and, in particular, the nanoparticle with a lateral area dimensioning in the range of approximately 7 nm×7 nm.

22. The method as claimed in one claim 15, comprising forming the nanostructure and, in particular, the nanoparticle with or from a chalcogenide material or a solid electrolyte.

23. The method as claimed in claims 15, comprising forming the nanostructure and, in particular, the nanoparticle with or from one material or a plurality of materials from the group consisting of a tungsten oxide or WOx, a titanium oxide or TiOx and a molybdenum oxide or MoOx.

24. The method as claimed in claim 15, comprising forming the first or bottom electrode device with or from one material or a plurality of materials from the group consisting of tungsten, molybdenum, titanium and the nitrides thereof.

25. The method as claimed in one claim 15, comprising forming the second or top electrode device with or from one material or a plurality of materials from the group consisting of silver, copper and aluminum.

26. The method as claimed in claim 15, comprising providing a species from the group consisting of metal ions, silver ions and silver cations as one or as the activating species.

27. The method as claimed in claim 15, comprising embedding the memory element and, in particular, the nanoparticle are embedded laterally in an insulation region.

28. The method as claimed in one claim 15, comprising forming the memory element and, in particular, the nanoparticle in cutouts of an insulation region provided between the first or bottom electrode device and the second or top electrode device.

29. The method as claimed in claims 15, comprising forming the memory cell as a CBRAM cell.

30. A memory device comprising:
   a plurality of memory cells;
   a nonvolatile memory cell;
   a memory material region activated by means of at least one species is provided as a memory element between a first electrode device and a second electrode device; and
   wherein the memory material region is nanostructure having a lateral extent in the range of approximately 7 nm to approximately 3 nm.

31. The memory device as claimed in claim 30, comprising wherein the nanostructure is formed as a self assembled structure, wherein the nanostructure is formed partially or completely in oxidic fashion, and wherein the nanostructure is formed with or from nanoparticles.

32. The memory device as claimed in claim 31, comprising wherein the memory material region including the nanostructure, are formed with or from one material or a plurality of materials from the group consisting of a tungsten oxide or WOx, a titanium oxide or TiOx and a molybdenum oxide or MoOx, wherein the nanostructure is formed as a monolayer, and wherein the nanostructure including the nanoparticle are formed with or from a sequence of layers or regions.

33. A nonvolatile memory cell comprising:
   means for providing a memory material region activated by means of at least one species, as a memory element between a first or bottom electrode device and a second or top electrode device; and
   wherein the memory material region is a nanostructure having a lateral extent in the range of approximately 7 nm to approximately 3 nm.

34. A nonvolatile memory cell comprising:
   a first electrode;
   a second electrode;
   a memory material region activated by means of at least one species provided as a memory element between the first electrode and the second electrode;
   wherein the memory material region is a nanostructure; and
   wherein the nanostructure is formed as a self assembled structure.

\* \* \* \* \*